(12) United States Patent
Sasaki

(10) Patent No.: US 8,704,600 B2
(45) Date of Patent: Apr. 22, 2014

(54) POWER AMPLIFIER

(75) Inventor: Yoshinobu Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 19 days.

(21) Appl. No.: 13/589,307

(22) Filed: Aug. 20, 2012

(65) Prior Publication Data

US 2013/0127543 A1    May 23, 2013

(30) Foreign Application Priority Data

Nov. 18, 2011    (JP) ................................ 2011-252952

(51) Int. Cl.
*H03F 3/191*    (2006.01)

(52) U.S. Cl.
USPC .............................. 330/302; 330/51; 330/310

(58) Field of Classification Search
USPC ................................ 330/51, 98, 150, 302, 310
See application file for complete search history.

(56) References Cited

U.S. PATENT DOCUMENTS

| | | | |
|---|---|---|---|
| 5,548,246 A | 8/1996 | Yamamoto et al. | |
| 7,479,827 B2 * | 1/2009 | Hau et al. | 330/302 |
| 8,102,205 B2 * | 1/2012 | Pletcher et al. | 330/51 |
| 8,149,050 B2 * | 4/2012 | Cabanillas | 330/310 |
| 8,207,790 B2 * | 6/2012 | Asada et al. | 330/302 |
| 2010/0033241 A1 | 2/2010 | Mori et al. | |
| 2012/0326784 A1 * | 12/2012 | Sasaki et al. | 330/251 |

FOREIGN PATENT DOCUMENTS

| | | |
|---|---|---|
| JP | 7-336168 A | 12/1995 |
| WO | WO 2008/068809 A1 | 6/2008 |

* cited by examiner

*Primary Examiner* — Khanh V Nguyen
(74) *Attorney, Agent, or Firm* — Leydig, Voit & Mayer, Ltd.

(57) ABSTRACT

A power amplifier includes an input terminal into which an input signal is input; a first amplification element amplifying the input signal; a second amplification element amplifying an output signal of the first amplification element; an output terminal from which an output signal of the second amplification element is output; a first matching circuit connected between an output of the second amplification element and the output terminal; a first switch connected between an output of the first amplification element and an input of the second amplification element; a second switch having a first end connected to the output of the first amplification element, and a second end; and a second matching circuit having a first end connected to the second end of the second switch, and a second end directly connected to the output of the second amplification element.

3 Claims, 6 Drawing Sheets

POWER AMPLIFIER

BACKGROUND OF THE INVENTION

1. Field of the Invention

The present invention relates to a power amplifier used for a mobile phone and the like.

2. Background Art

The power consumption of a power amplifier accounts for a high percentage of the entire consumption of a mobile phone. Accordingly, increase in efficiency of the power amplifier is important to reduce the power consumption. Thus, a power amplifier is adopted that switches between high and low output modes by means of a switch (e.g., see Japanese Patent Laid-Open No. 7-336168).

SUMMARY OF THE INVENTION

In a conventional power amplifier, the locus of impedance toward the output from each point in an output matching circuit for low power passes through a low impedance region. Accordingly, much current flows. This increases loss owing to the parasitic resistances of an inductor, a capacitor and a switch. Furthermore, the amplifier is sensitive to element unevenness in inductance and capacitance and to frequency characteristics.

The present invention is made in order to solve these problems. It is an object of the present invention to provide a power amplifier that is insensitive to element unevenness and frequency characteristics and has a low loss.

According to the present invention, a power amplifier includes: an input terminal from which an input signal is input; a first amplification element amplifying the input signal; a second amplification element amplifying an output signal of the first amplification element; an output terminal from which an output signal of the second amplification element is output; a first matching circuit connected between an output of the second amplification element and the output terminal; a first switch connected between an output of the first amplification element and an input of the second amplification element; a second switch having a first end connected to the output of the first amplification element, and a second end; and a second matching circuit having a first end connected to the second end of the second switch, and a second end directly connected to the output of the second amplification element.

The present invention makes it possible to provide a power amplifier that is insensitive to element unevenness and frequency characteristics and has a low loss.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
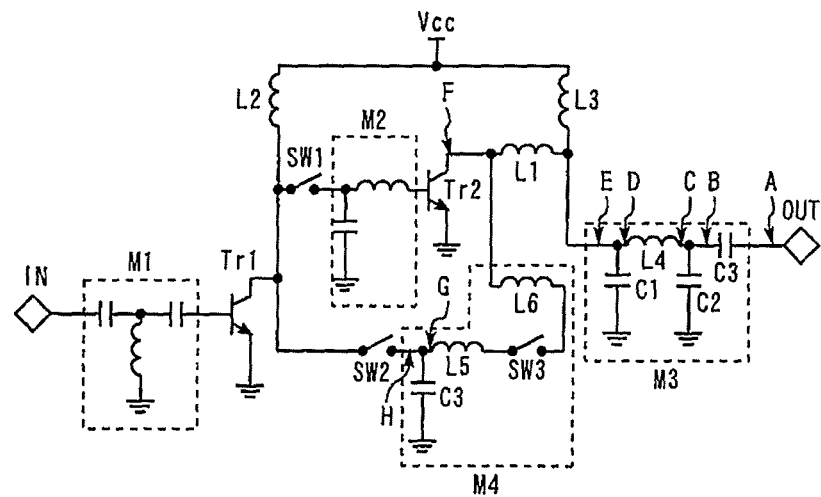
FIG. 1 is a circuit diagram showing a power amplifier according to a first embodiment of the present invention.

FIG. 1 is a circuit diagram showing a power amplifier according to a first embodiment of the present invention. An input terminal IN is connected with an input (base) of an amplification element (transistor) Tr1 via a matching circuit M1. A switch SW1 and a matching circuit M2 are connected between an output (collector) of the amplification element Tr1 and an input (base) of an amplification element Tr2. An inductor L1 and a matching circuit M3 are connected between an output (collector) of the amplification element Tr2 and an output terminal OUT.

The output of the amplification element Tr1 is connected with one end of a switch SW2. One end of the matching circuit M4 is connected to the other end of the switch SW2. The other end of the matching circuit M4 is directly connected to the output of the amplification element Tr2. The amplification elements Tr1 and Tr2 are supplied with a collector voltage from a power source Vcc via inductors L2 and L3, respectively.

The matching circuit M3 includes an inductor L4 and capacitors C1, C2 and C3. The matching circuit M4 includes inductors L5 and L6 and a capacitor C3 and a switch SW3. The matching circuit M3 for high power does not include the switch SW3, which causes loss; this is for reducing loss as much as possible.

In actuality, the amplifier further includes a base bias circuit for supplying a base current to the bases of the amplification elements Tr1 and Tr2, and a control circuit for controlling turning on and off of the switches SW1 to SW3 and the amplification elements Tr1 and Tr2, but they are omitted in the drawing.

Subsequently, an operation will be described. In a high gain and high output mode, the control circuit sets the switch SW1 on, sets the switches SW2 and SW3 off, and sets the transistors Tr1 and Tr2 on. First, an input signal input from the input terminal IN is amplified by the amplification element Tr1. Next, an output signal of the amplification element Tr1 is amplified by the second amplification element Tr2. Subsequently, an output signal of the amplification element Tr2 is output from the output terminal OUT via the matching circuit M3 for high power.

Meanwhile, in a low gain and low output mode, the control circuit sets the switches SW2 and SW3 on, sets the switch SW1 off, sets the transistor Tr1 on, and sets the transistor Tr2 off. First, an input signal input from the input terminal IN is amplified by the amplification element Tr1. Subsequently, an output signal of the amplification element Tr1 is output from the output terminal OUT via the matching circuits M3 and M4 for low power.

Figure 2:
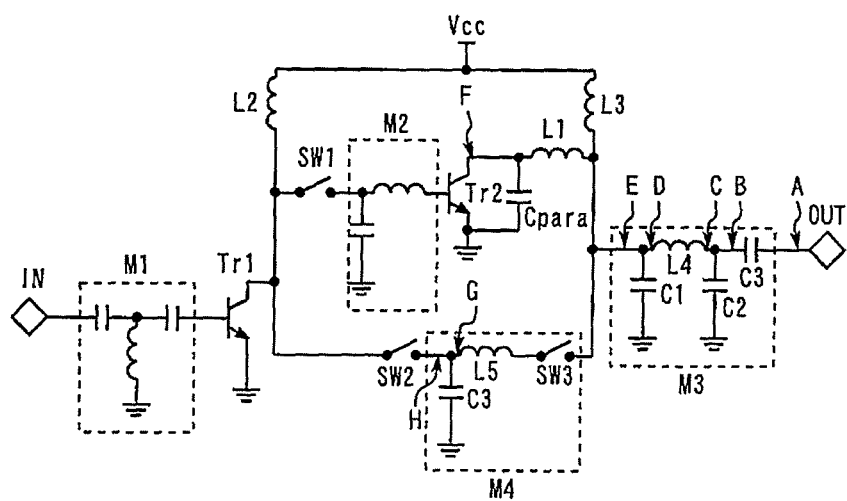
FIG. 2 is a circuit diagram showing a power amplifier according to the comparative example.

Advantageous effects of this embodiment will now be described in comparison with those of a comparative example. FIG. 2 is a circuit diagram showing a power amplifier according to the comparative example. In the comparative example, the other end of the matching circuit M4 is connected to the output of the amplification element Tr2 via the inductor L1.

Figure 3:
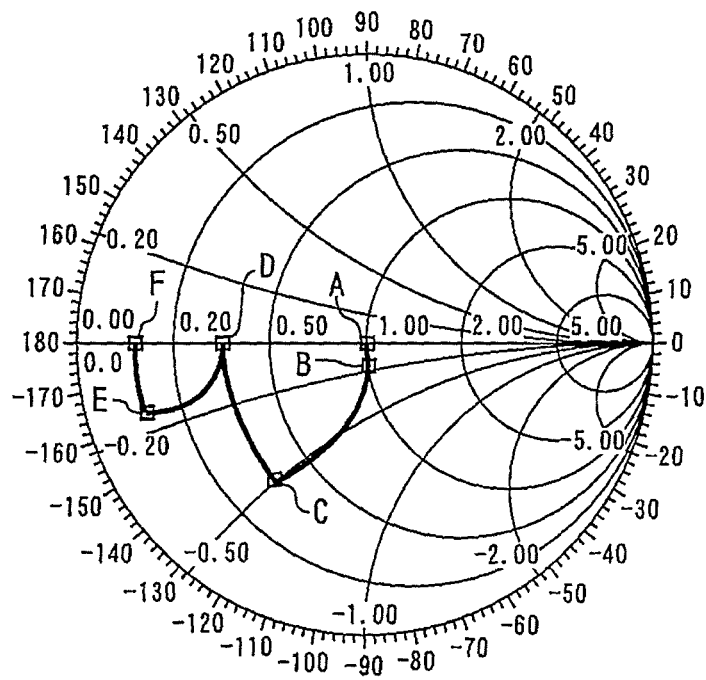
FIG. 3 is a Smith chart showing impedances of the matching circuit for high power of the first embodiment of the present invention at points toward the output.

FIG. 3 is a Smith chart showing impedances of the matching circuit M3 for high power of the first embodiment of the present invention at points (A to F) toward the output. More specifically, this chart plots the impedances at a desired frequency at the points toward the output on a Smith chart of a characteristic impedance of 50Ω. The impedances at the points in the matching circuit M3 for high power are the same as those in the comparative example.

Figure 4:
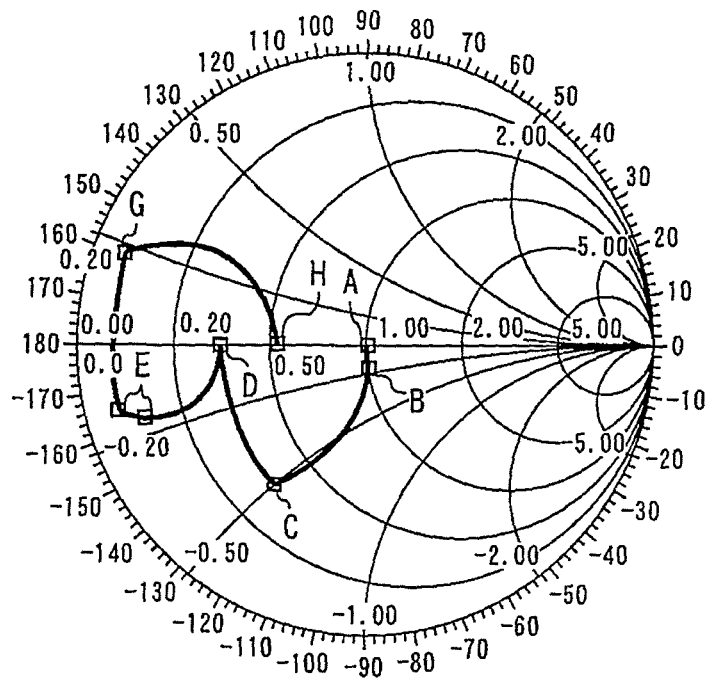
FIG. 4 is a Smith chart showing impedances of the matching circuits for low power in the comparative example at the points toward the output.

FIG. 4 is a Smith chart showing impedances of the matching circuits M3 and M4 for low power in the comparative example at the points (A to E, G and H) toward the output. In the comparative example, the other end of the matching circuit M4 is connected to the output of the amplification element Tr2 via the inductor L1. Accordingly, a parasitic capacitance Cpara of the amplification element Tr2 and the inductor L1 increase the effect of the parasitic capacitance Cpara. As a result, the impedance is further reduced at the point E. Accordingly, a large current flows, thereby increasing the loss owing to the inductor, the parasitic resistance of the capacitor and the parasitic resistance of the switch SW3. Furthermore, the locus of the impedance passes through a low impedance region. Accordingly, the amplifier becomes sensitive to element unevenness in inductance and capacitance and to frequency characteristics.

Figure 5:
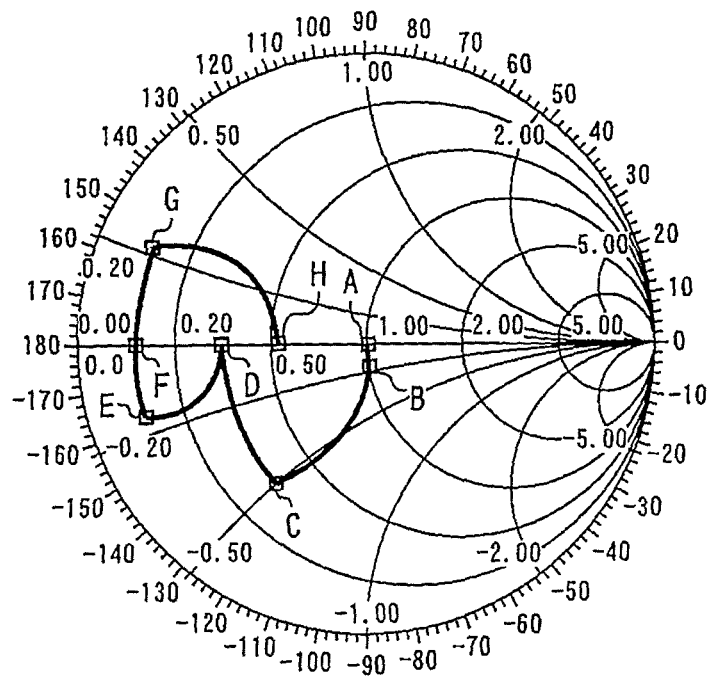
FIG. 5 is a Smith chart showing impedances of the matching circuits for low power in the first embodiment of the present invention at the points toward the output.

Meanwhile, FIG. 5 is a Smith chart showing impedances of the matching circuits M3 and M4 for low power in the first embodiment of the present invention at the points (A to E, G and H) toward the output. In the first embodiment, the other end of the matching circuit M4 is directly connected to the output of the amplification element Tr2. This limits the effect only to the parasitic capacitance Cpara of the amplification element Tr2, thus reducing the effect. Accordingly, at the point F, there is no further reduction in impedance; such reduction is identified in the comparative example. As a result, the locus of the impedance does not pass through the low impedance region. This reduces the loss due to the inductor, the parasitic resistance of the capacitor, and the parasitic resistance of the switch SW3. Furthermore, the amplifier becomes insensitive to element unevenness in inductance and capacitance and to frequency characteristics.

Second Embodiment

Figure 6:
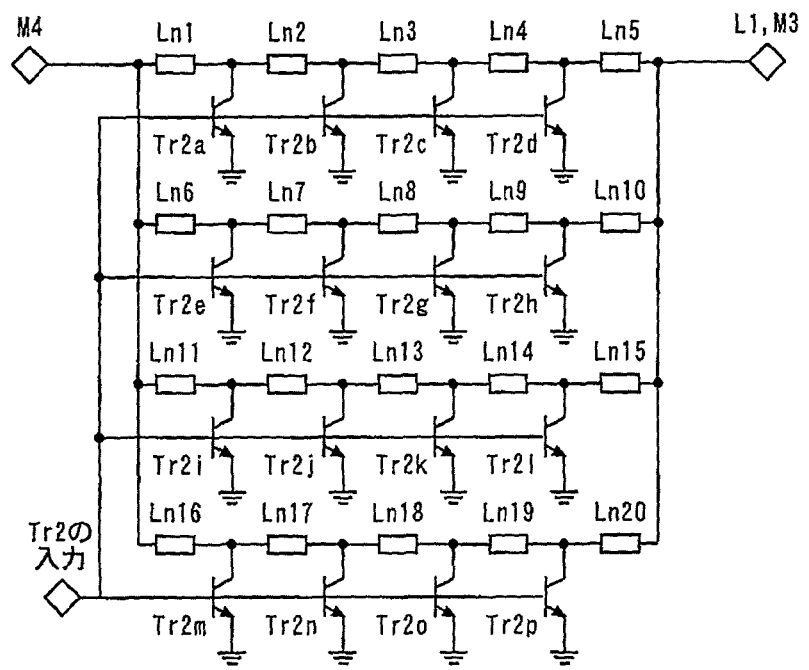
FIG. 6 is a circuit diagram showing an amplification element at the latter part according to a second embodiment of the present invention.

FIG. 6 is a circuit diagram showing an amplification element at the latter part according to a second embodiment of the present invention. The configuration and operation of the power amplifier are the same as those in the first embodiment.

Sixteen small-sized transistors Tr2a to Tr2p are connected in parallel. Lines Ln1 to Ln20 are connected between the collectors (outputs) of the transistors Tr2a to Tr2p. The bases (inputs) of the transistors Tr2a to Tr2p are connected to the input of the amplification element Tr2.

The lines Ln1 to Ln5 are connected in series to form a first series line. One end thereof is connected to the matching circuit M3 via the inductor L1. The other end is connected to the matching circuit M4. The other end of the first series line is arranged on an input side of the amplification element Tr2 with respect to the one end. The lines Ln6 to Ln20 are configured in the same manner as this configuration.

Figure 7:
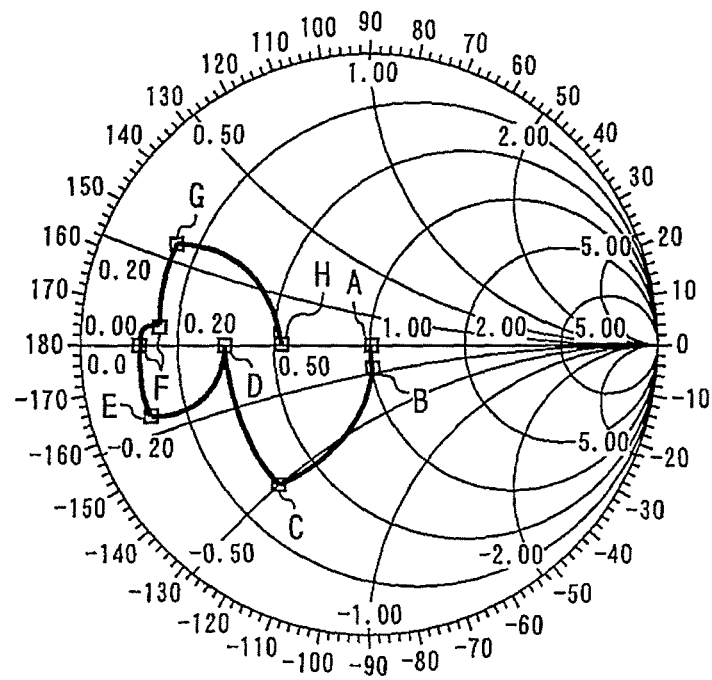
FIG. 7 is a Smith chart showing impedances of the matching circuits of the second embodiment of the present invention at points toward the output.

FIG. 7 is a Smith chart showing impedances of the matching circuits M3 and M4 of the second embodiment of the present invention at points (A to H) toward the output. The parasitic capacitances of the lines Ln1 to Ln20 and the transistors Tr2a to Tr2p form a distributed constant line, thereby further reducing the effects of the parasitic capacitances. This shifts the impedance from the inductor L6 of the matching circuit M4 to the inside of the Smith chart, and makes the impedance high. Accordingly, the amplifier further becomes insensitive to the element unevenness and frequency characteristics, and allows the loss to be further reduced.

Third Embodiment

Figure 8:
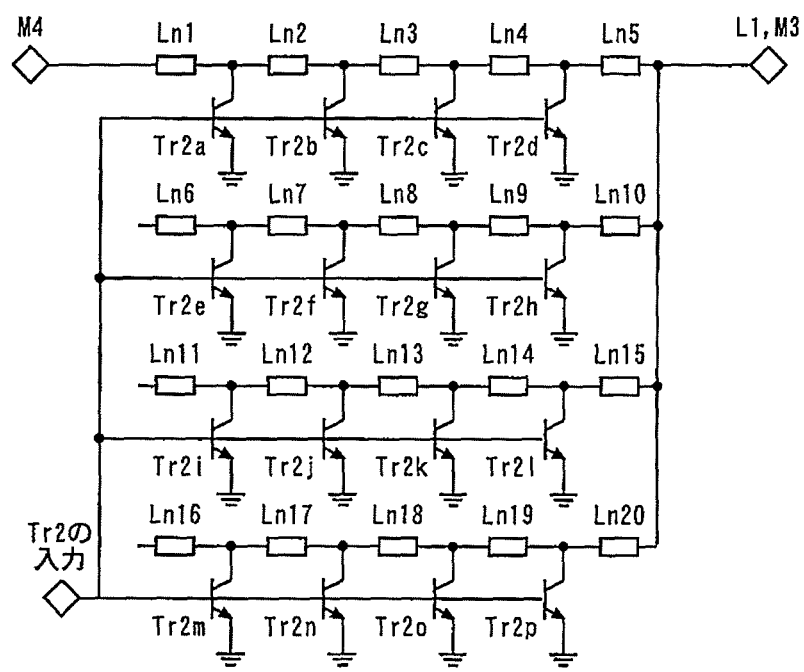
FIG. 8 is a circuit diagram showing an amplification element at the latter part of a third embodiment of the present invention.

FIG. 8 is a circuit diagram showing an amplification element at the latter part of a third embodiment of the present invention. Only parts of the configuration different from those in the second embodiment will be described. Lines Ln6 to Ln10 are connected in series to form a second series line. One end of this line is connected to the matching circuit M3 via the inductor L1. The other end is not connected to the matching circuit M4. Lines Ln11 to Ln20 are also configured in the same manner.

Figure 9:
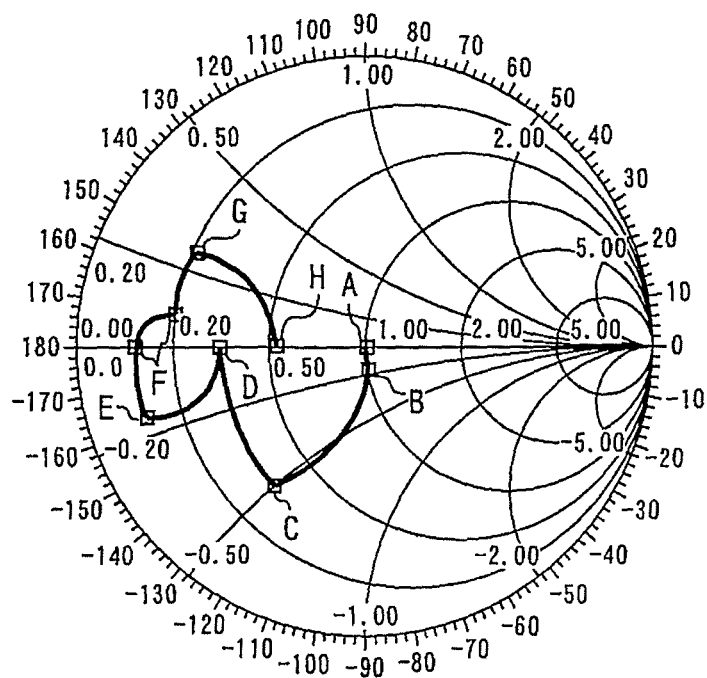
FIG. 9 is a Smith chart showing impedances of the matching circuits of a third embodiment of the present invention at points toward the output.

FIG. 9 is a Smith chart showing impedances of the matching circuits M3 and M4 of a third embodiment of the present invention at points (A to H) toward the output. Only the first series line including the lines Ln1 to Ln5 is connected to the matching circuit 4. Accordingly, the parasitic inductance of the lines Ln1 to Ln20 is higher than that in the second embodiment; the effect of the parasitic capacitance of the transistors Tr2a to Tr2p is further reduced. This shifts the impedance from the inductor L6 of the matching circuit M4 to the inside of the Smith chart, and makes the impedance high. Accordingly, the amplifier further becomes insensitive to the element unevenness and frequency characteristics, and allows the loss to be further reduced.

Fourth Embodiment

Figure 10:
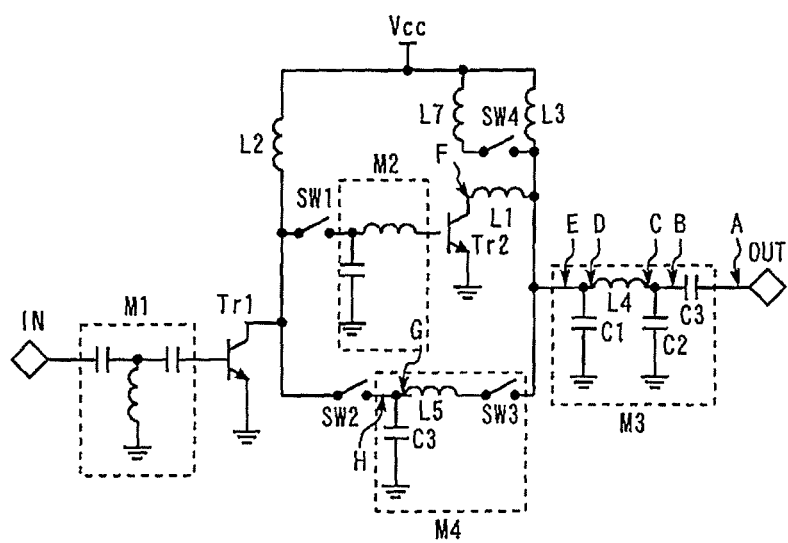
FIG. 10 is a circuit diagram showing a power amplifier according to a fourth embodiment of the present invention.

FIG. 10 is a circuit diagram showing a power amplifier according to a fourth embodiment of the present invention. The other end of the matching circuit M4 is connected to the connection between the inductor L1 and the matching circuit M3. The inductor L7 is connected to the inductor L3 in parallel between the output of the amplification element Tr2 and the power source Vcc. The switch SW4 is connected to the inductor L3 in parallel, and to the inductor L7 in series. The other parts of the configuration are the same as those in the first embodiment.

An operation thereof will now be described. In the high gain and high output mode, the control circuit sets the switch SW1 on, sets the switches SW2, SW3 and SW4 off, and sets the transistors Tr1 and Tr2 on. First, an input signal input from the input terminal IN is amplified by the amplification element Tr1. Next, an output signal of the amplification element Tr1 is amplified by the second amplification element Tr2. Subsequently, an output signal of the amplification element Tr2 is output from the output terminal OUT via the matching circuit M3 for high power.

Meanwhile, in the low gain and low output mode, the control circuit sets the switches SW2, SW3 and SW4 on, sets the switch SW1 off, sets the transistor Tr1 on, and sets the transistor Tr2 off. First, an input signal input from the input terminal IN is amplified by the amplification element Tr1. Subsequently, an output signal of the amplification element Tr1 is output from the output terminal OUT via the matching circuits M3 and M4 for low power.

The advantageous effects of this embodiment will now be described. The impedances at the matching circuit M3 for high power at the points (A to E) toward the output in the fourth embodiment of the present invention are the same as those in the first embodiment (Smith chart of FIG. 3).

Figure 11:
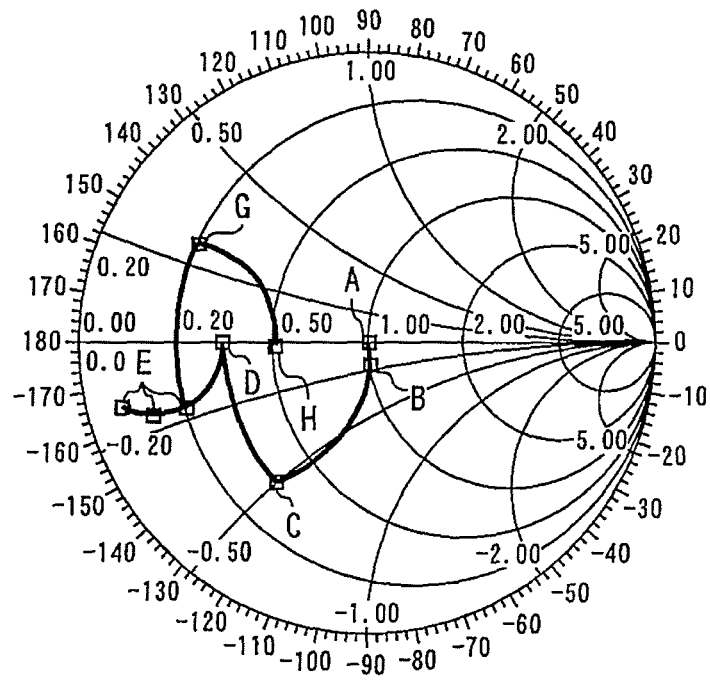
FIG. 11 is a Smith chart showing impedances of the matching circuits for low power at the points toward the output in the fourth embodiment of the present invention.

FIG. 11 is a Smith chart showing impedances of the matching circuits M3 and M4 for low power at the points (A to E, G and H) toward the output in the fourth embodiment of the present invention. In the low gain and low output mode, the switch SW4 is on to connect the inductor L7 to the collector of the amplification element Tr2. The inductor L7 reduces the effect of the parasitic capacitance Cpara of the amplification element Tr2. Accordingly, the impedance at the point E is once shifted to the low impedance side owing to the effect of the parasitic capacitance Cpara. However, since the switch SW4 thus connects the inductor L7, the impedance is shifted to the high impedance side. As a result, the locus of the impedance hardly passes through the low impedance region. This reduces the loss due to the inductor, the parasitic resistance of the capacitor and the parasitic resistance of the switch SW3. Furthermore, the amplifier becomes insensitive to element unevenness in inductance and capacitance and to frequency characteristics.

The embodiments have described the two-stage amplifier. However, without limitation thereto, amplifiers of two or more stages can exert the same effects. The amplification elements Tr1 and Tr2 are, for instance, HBTs (heterojunction bipolar transistors). However, the element may be another bipolar transistor or FET, such as MOSFET (metal oxide semiconductor field effect transistor).

The matching circuit M3 has the configuration of L, C, L, C and C. Without limitation thereto, it is suffice a capacitor or an inductor is adopted in a part thereof. The inductor may be configured by a transmission line. Although the LC circuit is adopted as the matching circuit M4, another configuration may be adopted only if the circuit can realize the impedance from the output of the amplification element Tr1. The two switches SW2 and SW3 are used for switching the mode. However, any of the two is not necessarily used.

The third and fourth embodiments adopt the configuration of the amplification element Tr2 including four rows×four columns. However, another configuration may be adopted. Furthermore, in the fourth embodiment, only one series line is connected to the matching circuit 4. However, a plurality of lines may be connected.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-252952, filed on Nov. 18, 2011, including specification, claims, drawings, and summary, on which the Convention priority of the present application is based, is incorporated herein by reference in its entirety.

What is claimed is:

1. A power amplifier comprising:
an input terminal into which an input signal is input;
a first amplification element amplifying the input signal;
a second amplification element amplifying an output signal of the first amplification element;
an output terminal from which an output signal of the second amplification element is output;
a first matching circuit connected between an output of the second amplification element and the output terminal;
a first switch connected between an output of the first amplification element and an input of the second amplification element;
a second switch having a first end, connected to the output of the first amplification element, and a second end; and
a second matching circuit having a first end connected to the second end of the second switch, and a second end directly connected to the output of the second amplification element, wherein
the second amplification element includes a plurality of first transistors connected in parallel, and a plurality of first lines connected between outputs of the plurality of first transistors,
inputs of the plurality of first transistors are connected to the input of the second amplification element,
the first lines are connected in series to form a first series line,
a first end of the first series line is connected to the first matching circuit,
a second end of the first series line is connected to the second matching circuit, and
the second end of the first series line is arranged on an input side of the second amplification element with respect to the first end of the first series line.

2. The power amplifier according to claim 1, wherein the second amplification element includes a plurality of second transistors connected in parallel, and a plurality of second lines connected between outputs of the plurality of second transistors,
inputs of the plurality of second transistors are connected to the input of the second amplification element,
the second lines are connected in series to form a second series line,
a first end of the second series line is connected to the first matching circuit, and
a second end of the second series line is not connected to the second matching circuit.

3. A power amplifier comprising:
an input terminal into which an input signal is input;
a first amplification element amplifying the input signal;
a second amplification element amplifying an output signal of the first amplification element;
an output terminal from which an output signal of the second amplification element is output;
a matching circuit connected between an output of the second amplification element and the output terminal;
a first switch connected between an output of the first amplification element and an input of the second amplification element;
a second switch having a first end connected to the output of the first amplification element, and a second end connected to the output terminal via the matching circuit;
a first inductor connected between the output of the second amplification element and a power source;
a second inductor connected in parallel with the first inductor; and
a third switch connected in parallel with the first inductor and connected in series to the second inductor.

* * * * *